(12) United States Patent
Ikenoue

(10) Patent No.: US 6,932,629 B2
(45) Date of Patent: Aug. 23, 2005

(54) DEVICE WITH USB TERMINAL

(75) Inventor: Kazuhisa Ikenoue, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/980,302

(22) Filed: Nov. 4, 2004

(65) Prior Publication Data

US 2005/0130469 A1    Jun. 16, 2005

(30) Foreign Application Priority Data

Nov. 5, 2003  (JP) .............................. 2003-376021

(51) Int. Cl.⁷ ............................................ H01R 13/44

(52) U.S. Cl. ...................... 439/138; 439/136; 439/137

(58) Field of Search ................................ 439/134, 135, 439/136, 137, 138, 139, 140, 141; 361/725, 361/752

(56) References Cited

U.S. PATENT DOCUMENTS

| | | | |
|---|---|---|---|
| 6,456,500 B1 * | 9/2002 | Chen | 439/136 |
| 6,612,853 B2 * | 9/2003 | Wu | 439/136 |
| 6,808,400 B2 * | 10/2004 | Tu | 439/131 |
| 2003/0223286 A1 * | 12/2003 | Lee | 439/136 |

FOREIGN PATENT DOCUMENTS

JP            2004-5407        8/2004

* cited by examiner

Primary Examiner—Briggitte R. Hammond
(74) Attorney, Agent, or Firm—Oblon, Spivak, McClelland, Maier & Neustadt, P.C.

(57) ABSTRACT

A device main body with a USB terminal and a cap including a housing space for housing at least the USB terminal are provided. The device main body and the cap are assembled so that they can be moved in an extending or compressing manner relative to each other by inserting at least the USB terminal to the housing space, or can be rotated relative to each other in an extended state without removing the cap from the device main body.

13 Claims, 16 Drawing Sheets

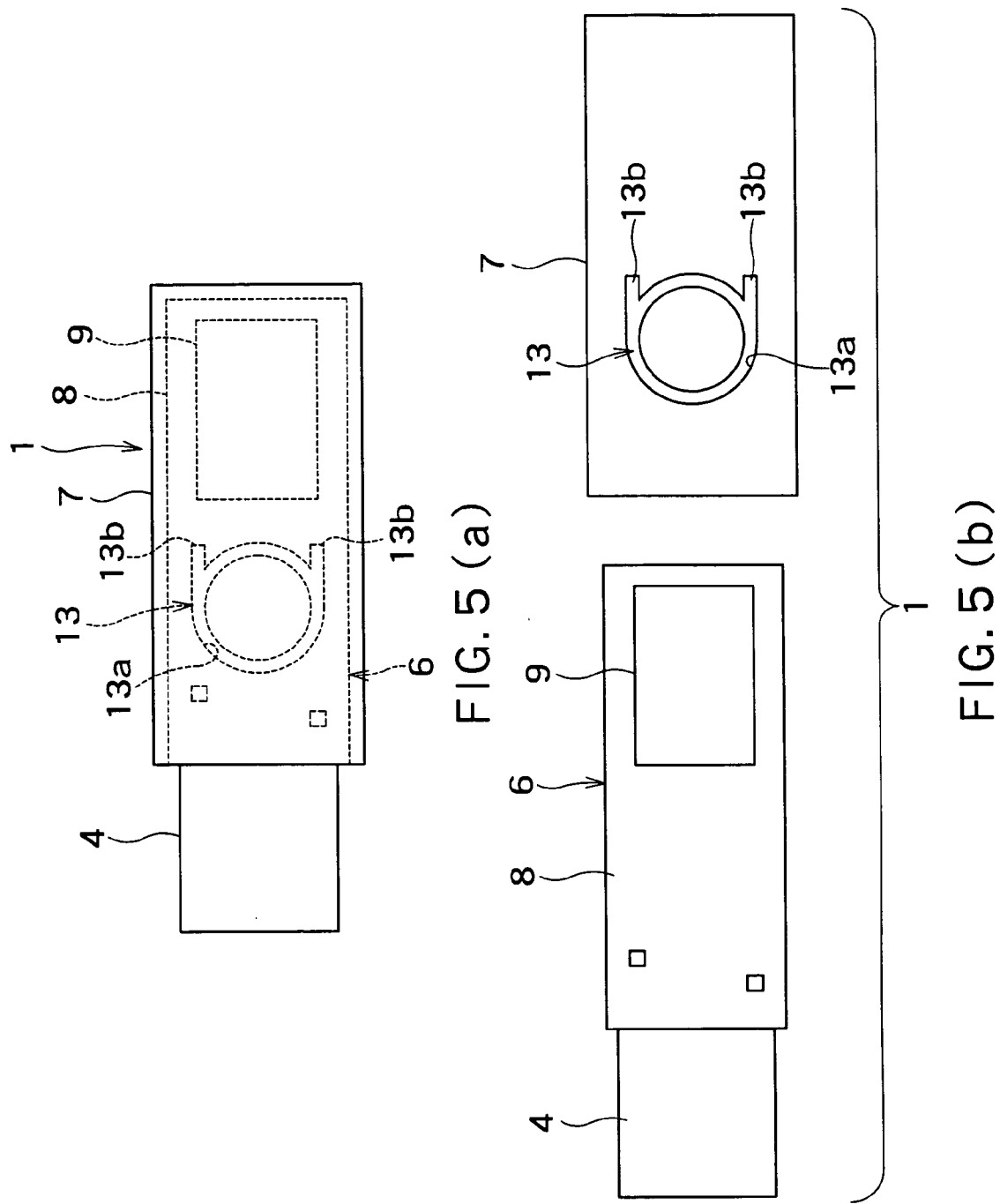

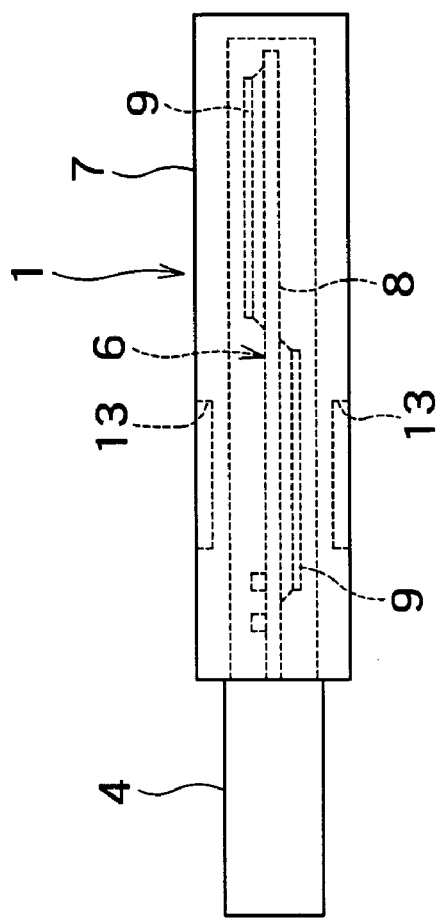
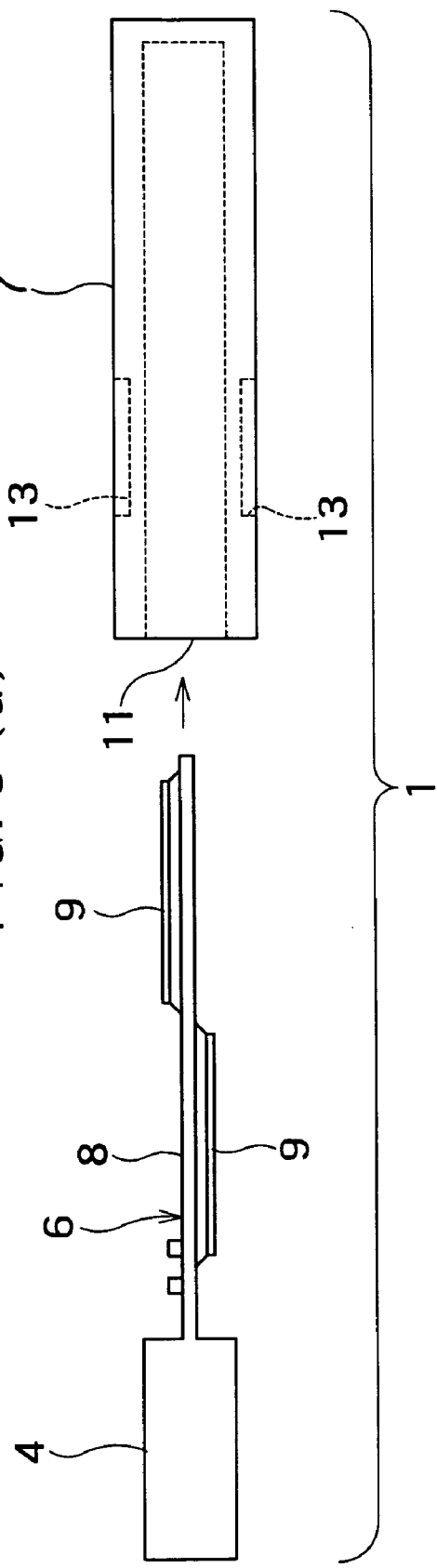
FIG. 6(a)
FIG. 6(b)

DEVICE WITH USB TERMINAL

CROSS-REFERENCE TO RELATED APPLICATION

This application is based upon and claims the benefit of priority from prior Japanese Patent Application No. 2003-376021, filed on Nov. 5, 2003, the entire contents of which are incorporated herein by reference.

BACKGROUND OF THE INVENTION

1. Field of the Invention

The present invention relates to a personal computer (PC) peripheral device with a USB terminal.

2. Background Art

There are various kinds of PC peripheral devices including USB connectors. A USB flash memory is an example of such a device, which includes, for example, a memory main body and a removable cap separately formed to protect the memory main body. The memory main body is manufactured by incorporating and housing a memory function part (including a flash memory and its controller, etc.) in a printed circuit board (PCB), and adjusting one end of the PCB to serve as a USB connector. That is to say, apparently, the USB connector of the memory main body projects from the housing case. The cap is removably attached to such a USB connector portion of the memory main body. This cap is formed separate from the memory main body, and removed from the memory main body when the memory main body is used. Since the cap is small, there has been a concern that the cap can be lost.

As described above, in a PC peripheral device such as a USB memory including a USB connector, there has been a problem in that a cap for protecting the USB connector portion of the memory main body, which is removed when the memory main body is in use, can be easily lost.

SUMMARY OF THE INVENTION

According to a first aspect of the present invention, there is provided a device with a USB terminal including:
a device main body including a USB terminal; and
a cap including a housing space for housing at least the USB terminal,
the device main body and the cap being assembled so that they can be moved in an extending or compressing manner relative to each other by inserting at least the USB terminal to the housing space, or can be rotated relative to each other in an extended state,
the cap including a base member, and a top plate and a bottom plate facing each other, the top plate and bottom plate being supported by the base member, and the housing space being formed by the base member, the top plate, and the bottom plate,
projections used for slidable rotation being formed on one of an internal surface of at least one of the top plate and the bottom plate, and at least one of an upper surface and a lower surface of the device main body, and slidable rotation guide grooves, in which the projections are inserted, being formed on the other,
each of the slidable rotation guide grooves including a circular groove portion, which is substantially circular, and guide groove portions formed to be integral with the circular groove portions and extending in a compressing or extending direction of the device main body and the cap,
the device main body and the cap being moved in the extending or compressing manner relative to each other when the projections are moved between the guide groove portions and the circular groove portions, and being rotated relative to each other when the projections are slid in the circular groove portions, and
at a first position where the device main body and the cap are close to each other, the projections being located in the guide groove portions, at a second position where the device main body and the cap have been moved so as to be away from each other, the projections being located in the circular groove portions, a third position of the device main body and the cap being achieved when the projections are rotated from the second position within the circular groove portions, and a fourth position being achieved when the projections are reversely moved in the guide groove portions from the third position.

According to a second aspect of the present invention, there is provided a device with a USB terminal including:
a device main body including a USB terminal; and
a cap including a housing space for housing the device main body at a side of the USB terminal,
the cap including a base member, and a top plate and a bottom plate facing each other, the top plate and bottom plate being supported by the base member, and the housing space being formed by the base member, the top plate, and the bottom plate,
projections used for slidable rotation being formed on one of an internal surface of at least one of the top plate and the bottom plate and at least one of an upper surface and lower surface of the device main body, and slidable rotation guide grooves, in which the projections used for slidable rotation are slidably and rotatably inserted, are formed on the other along an axial or longitudinal direction of the device main body and the cap, and a length of the slidable rotation guide grooves being adjusted such that the device main body and the cap can be located in a close position for preventing a rotational movement relative to each other, and a distant position for performing a rotational movement relative to each other.

According to a third aspect of the present invention, there is provided a device with a USB terminal including:
a device main body including a USB terminal; and
a cap including a housing space for housing at least the USB terminal,
the cap including a base member, and a top plate and a bottom plate facing each other, the top plate and bottom plate being supported by the base member, and the housing space being formed by the base member, the top plate, and the bottom plate,
projections used for slidable rotation being formed on one of an internal surface of at least one of the top plate and the bottom plate, and at least one of an upper surface and a lower surface of the device main body, and slidable rotation guide grooves, in which the projections are inserted, being formed on the other,
the device main body and the cap being moved in an extending or compressing manner relative to each other when the projections are relatively slid in the grooves, and the device main body and the cap being moved in a rotational manner relative to each other when the projections and the grooves are rotated relative to each other.

BRIEF DESCRIPTION OF THE DRAWINGS

FIG. 5(a) is a plan view of the memory main body, and FIG. 5(b) is an exploded plan view of a board assembly thereof and a main body casing thereof.

FIG. 6(a) is a side view of the memory main body, and FIG. 6(b) is an exploded side view of the board assembly thereof and the main body casing thereof.

DESCRIPTION OF THE EMBODIMENTS

The present invention can be applied to various kinds of devices such as a PC peripheral device including a USB terminal. Hereinafter, an embodiment of a USB flash memory will be described. In this embodiment, a cap which is formed separate from a memory main body (device main body) is not formed so as to be completely separated and removed from the memory main body. The cap and the memory main body can perform a linear movement and a rotational movement relative to each other with the fixing of the cap to the memory main body being maintained. Accordingly, the cap is not removed from the memory main body but moves relative thereto so that the USB connector portion is exposed and is connected to a personal computer, etc. with the cap and the memory main body remaining attached to each other.

Figure 1:
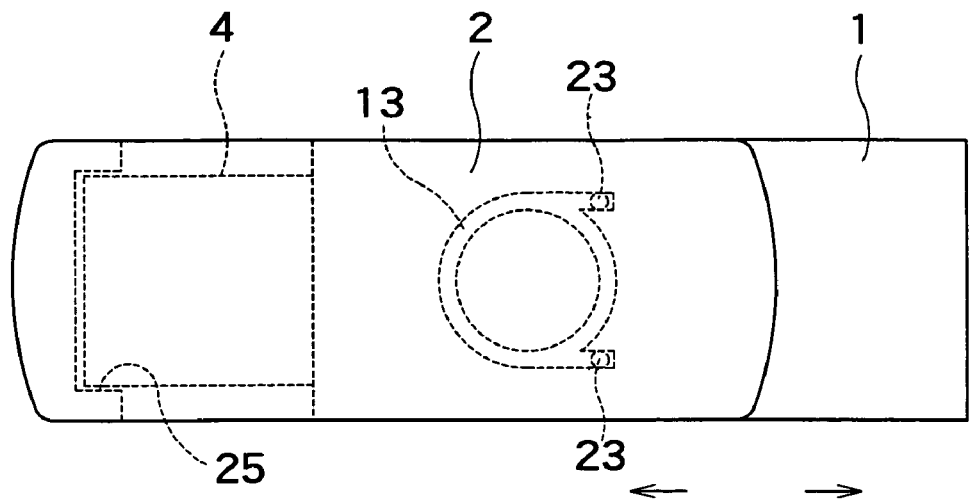
FIG. 1 is a plan view of a USB flash memory according to an embodiment of the present invention.
Figure 2:
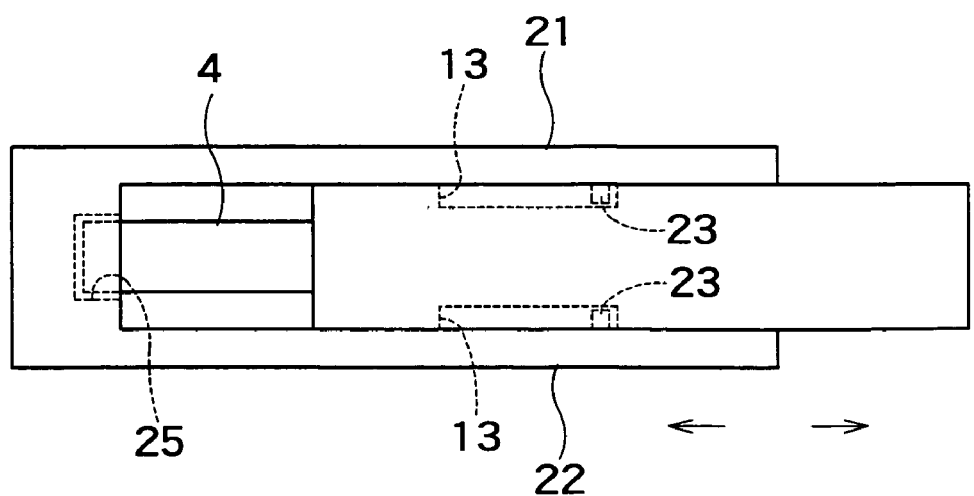
FIG. 2 is a side view of the USB flash memory of FIG. 1.

Hereinafter, the embodiment of the USB flash memory will be described in more detail. FIG. 1 shows an entire plan view of this flash memory, and FIG. 2 shows the side view thereof. As can be understood from these drawings, the USB flash memory includes a memory main body 1 and a cap 2. The memory main body 1 and the cap 2 are separately formed and combined. That is to say, in a normal use, these elements can slide or rotate relative to each other, but cannot be removed from each other. In FIG. 7 to FIG. 13, which will be described later, the cap 2 is pulled away from the memory main body 1 and rotated around an axis perpendicular to the drawing sheet.

Figure 7:
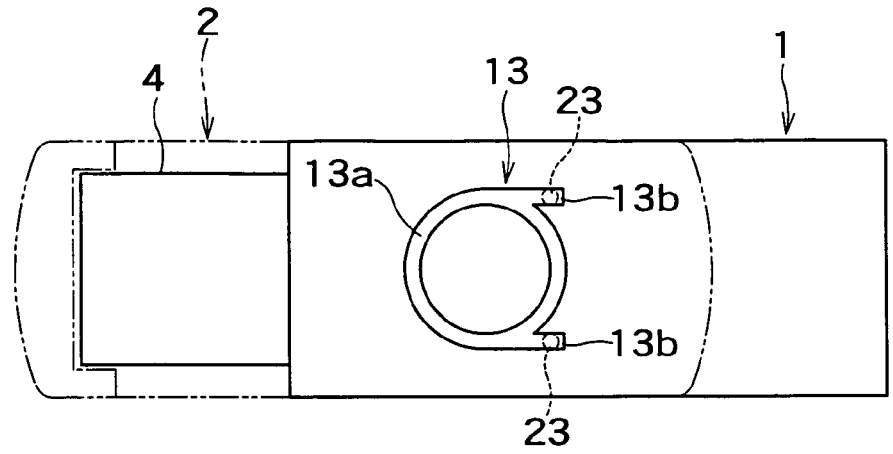
FIG. 7 is a plan view for explaining a positional state of the memory main body and the cap.
Figure 13:
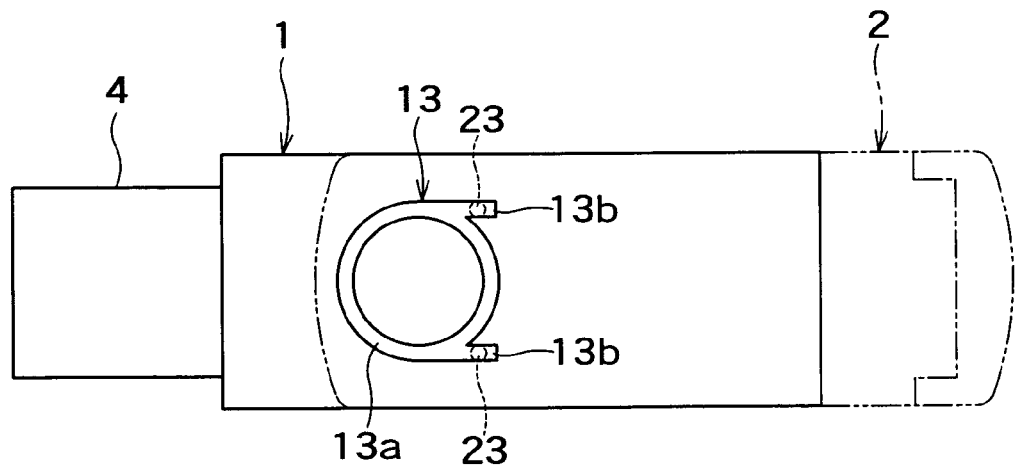
FIG. 13 is a plan view for explaining a positional state of the memory main body and the cap.

FIG. 7 shows the memory main body 1 and the cap 2 in a carrying state, and FIG. 13 shows them in a usage state. In both FIG. 7 and FIG. 13, the memory main body 1 and the cap 2 are attached to each other so as not to rotate relative to each other. In order to easily distinguish the two elements from each other in these drawings, the memory main body 1 is shown by a solid line, and the cap 2 is shown by a dot-and-dash line.

Figure 3:
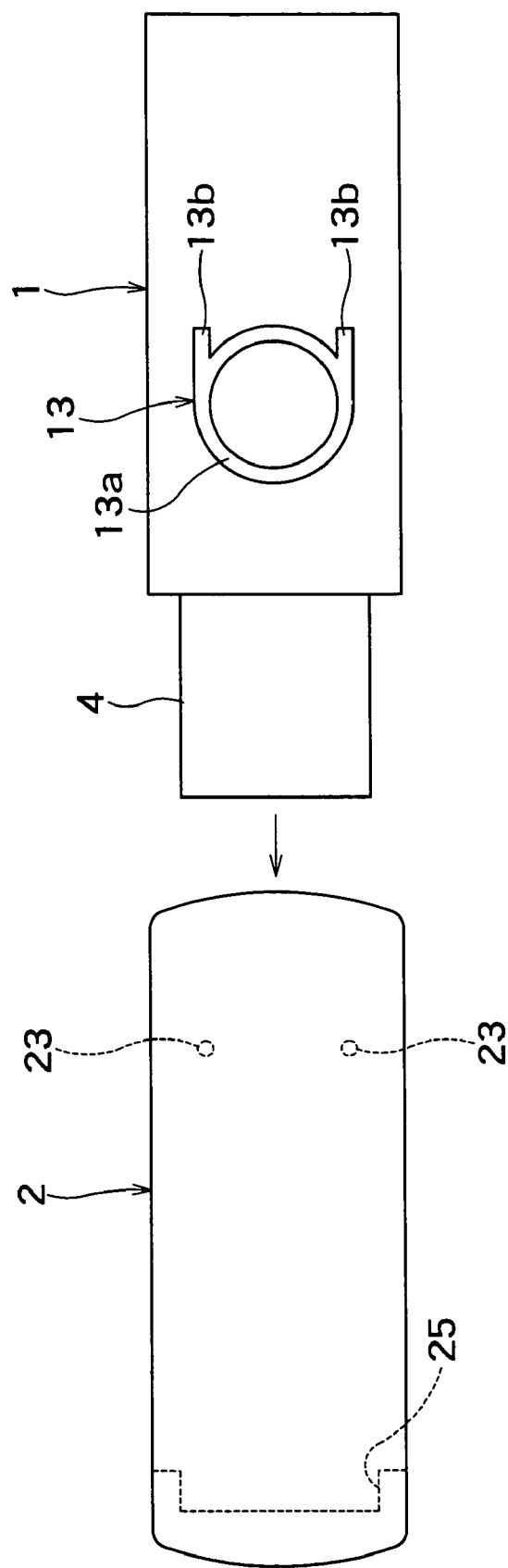
FIG. 3 is a plan view of a memory main body and a cap of the USB flash memory of FIG. 1, which are separated.
Figure 4:
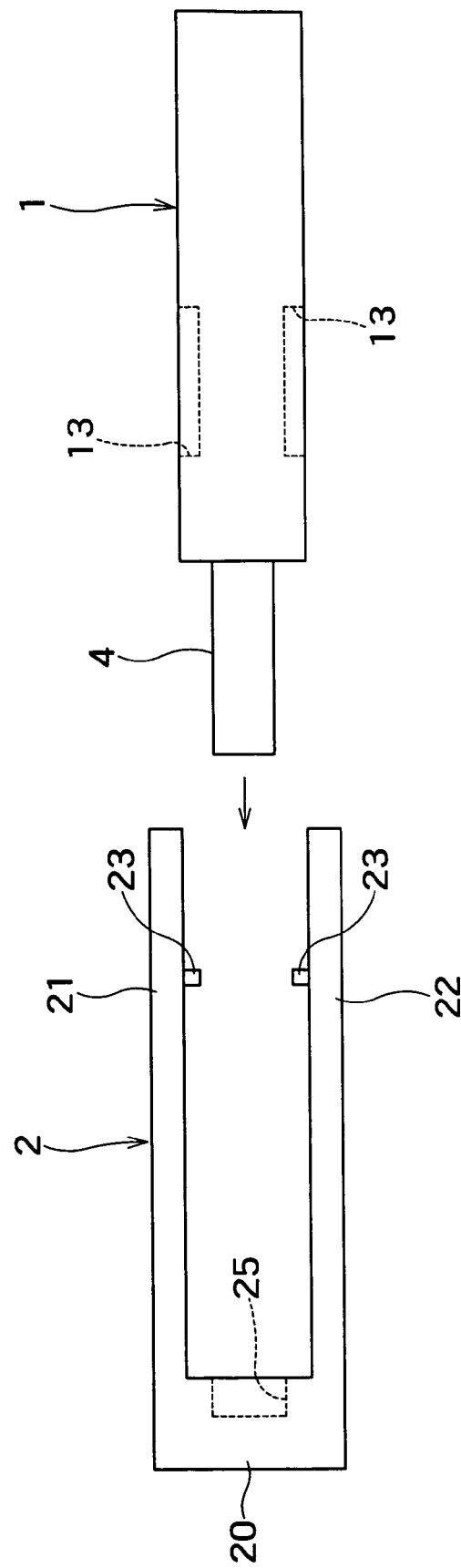
FIG. 4 is a side view of the memory main body and the cap, which are separated.

FIG. 3 is a plan view and FIG. 4 is a side view showing the state in which the memory main body 1 and the cap 2 are forcibly removed from each other. As can be understood from FIG. 3 and FIG. 4, the memory main body 1 is formed substantially in a shape of a box from which a USB terminal 4 is projected. As can be understood from FIGS. 5(a), 5(b), 6(a), and 6(b), the memory main body 1 includes a board assembly 6 and a main body housing 7. FIGS. 5(a), 5(b), 6(a) and 6(b) are plan views and side views of these elements in an assembled state and a separated state. That is to say, as can be understood from FIGS. 5(b) and 6(b), the memory main body 1 is formed by covering the board assembly 6 with a separately-formed main body housing 7.

As can be understood especially from FIG. 6(b), the board assembly 6 is formed by attaching semiconductor chips 9,9 . . . at upper and lower surfaces of a board 8 such as a PCB, one end of which is the USB terminal 4.

As can also be understood from FIG. 6(b), the main body housing 7, into which the board assembly 6 is inserted, is formed as a housing having an opening 11 at the side the board assembly 6 is inserted. As can be understood especially from FIGS. 5(b) and 6(b), substantially circular slidable rotation guide grooves 13;13 are concavely formed on the upper and the lower surfaces of the main body housing 7. As will be described later with reference to FIG. 3, two projections used for slidable rotation 23,23;23,23 projecting from the internal surfaces of a top plate 21 and a bottom plate 22 of the cap 2 engage with the grooves 13;13. As shown in FIGS. 7 to 13, in this state the memory main body 1 and the cap 2 can slide relative to each other in the axial or longitudinal direction, and can rotate relative to each other. That is to say, as can be understood especially from FIG. 3, each groove 13 has a circular groove portion 13a and a pair of substantially linear guiding groove portions 13b, 13b connected thereto.

Such a board assembly 6 and a main body housing 7, which are separately formed as shown in FIG. 6(b), are assembled as shown in FIG. 6(a), to form the memory main body 1.

As can be understood especially from FIG. 4, the cap 2 attached to such a memory main body 1 has a base member 20 and a top plate 21 and a bottom plate 22 extending therefrom so as to be opposed to each other. The tip portion and the side portions of the cap 2 are open. As mentioned before, the projections used for slidable rotation 23,23;23,23 are formed on the internal surfaces of the top plate 21 and the bottom plate 22. The projections 23,23;23,23 engage with the slidable rotation guide grooves 13;13 of the aforementioned memory main body 1. The plan view of the engaged state is shown, e.g., in FIG. 1, and the side view thereof is shown in FIG. 2.

The reference numeral 25 in FIGS. 1 and 2 denotes a groove concavely formed in the base member 20, to which the tip portion of the USB terminal 4 can be inserted. The insertion of the tip portion prevents the memory main body 1 and the cap 2 from greatly rotating relative to each other. Furthermore, since the opening of the USB terminal 4 is covered by the groove 25, the adhesion of dust, etc., to the USB terminal 4 can be prevented.

Since the projections used for slidable rotation 23,23;23,23 and the slidable rotation guide grooves 13,13 engage with each other as mentioned above, the memory main body 1 and the cap 2 are moved as follows, which will be described with reference to FIGS. 7 to 13. For the purpose of easy understanding, in these drawings, the memory main body 1 is shown by a solid line, and the cap 2 is shown by a dot-and-dash line.

FIG. 7 shows the assembled state of the memory main body 1 and the cap 2 (the first position). That is to say, the grooves 13;13 of the memory main body 1 and the projections 23,23;23,23 of the cap 2 are formed so as to meet the positional relationship shown in FIG. 7.

In this state, the projections 23,23;23,23 are in the guide groove portions 13b,13b, and the rotations of the memory main body 1 and the cap 2 relative to each other are prevented.

In the state shown in FIG. 7, the memory main body 1 and the cap 2 are pulled away from each other. At this time, the projections 23,23;23,23 slide in the horizontal direction in the drawing in the grooves 13;13 and reach the circular groove portions 13a;13a as shown in FIG. 8 (the second position).

Figure 9:
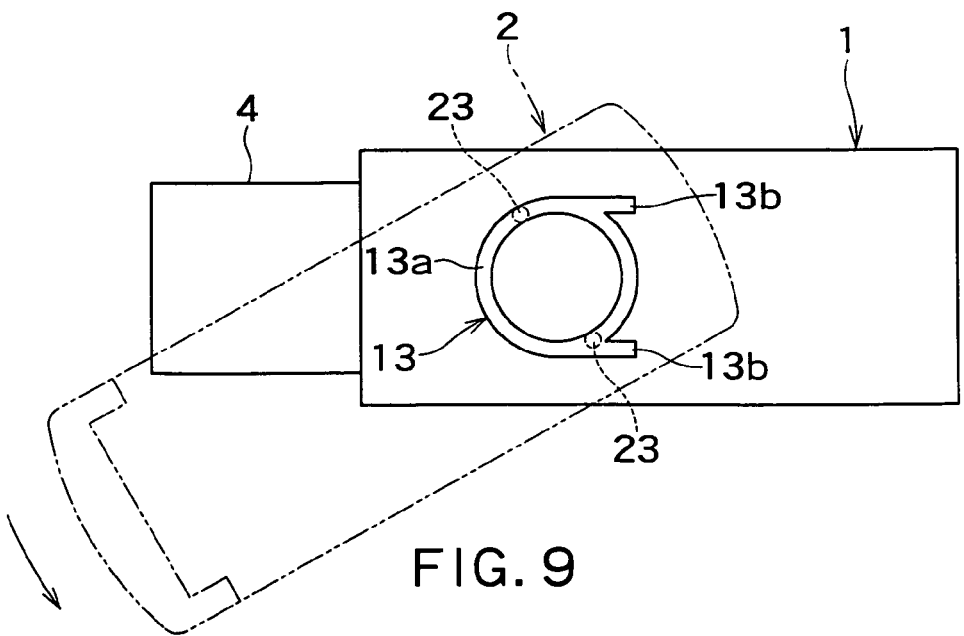
FIG. 9 is a plan view for explaining a positional state of the memory main body and the cap.
Figure 10:
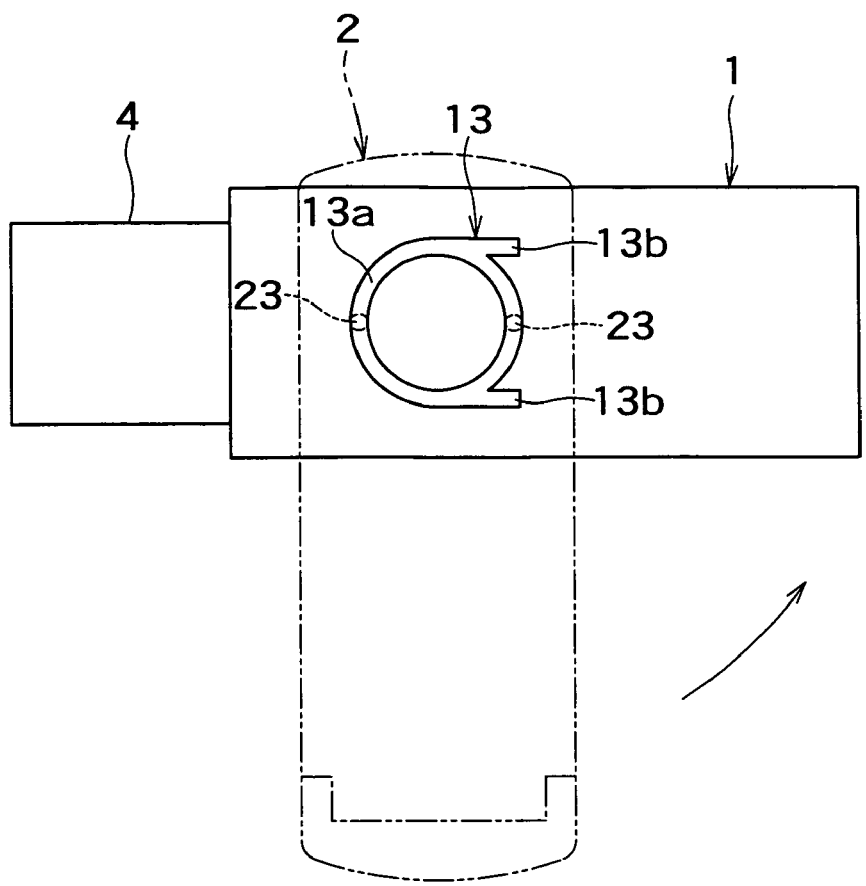
FIG. 10 is a plan view for explaining a positional state of the memory main body and the cap.
Figure 11:
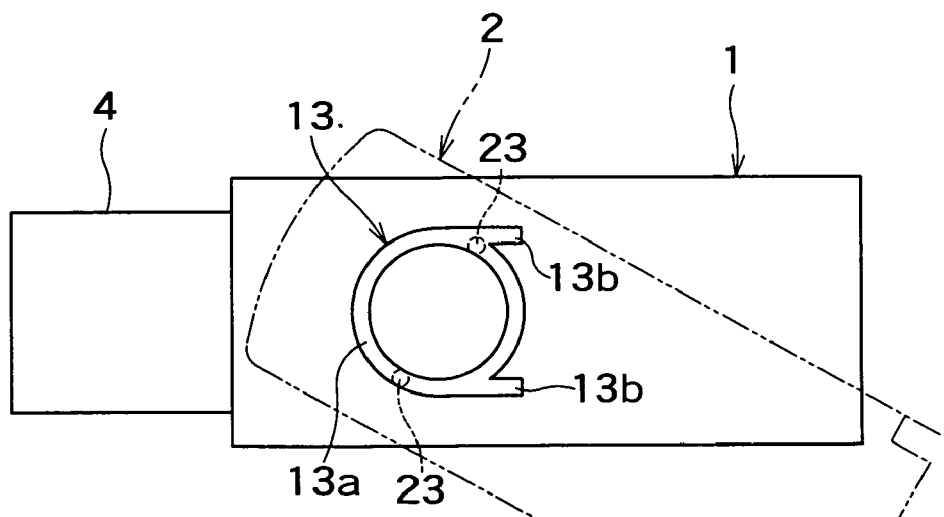
FIG. 11 is a plan view for explaining a positional state of the memory main body and the cap.

Thereafter, as can be understood from FIG. 9, the cap 2 is rotated around the axis perpendicular to the drawing paper relative to the memory main body 1. That is to say, the cap 2 is rotated counterclockwise to reach the state shown in FIG. 12 (the third position) via the states shown in FIGS. 10 and 11. In the state shown in FIG. 12, the memory main body 1 and the cap 2 are slid so as to be close to each other in the direction opposite to the previous direction, thereby reaching the state shown in FIG. 13 (the fourth position). That is to say, the projections 23,23;23,23 of the cap 2 are inserted into the guide groove portions 13b,13b;13b,13b of the memory main body 1 again. As a result, the rotations of the memory main body 1 and the cap 2 are prevented when the USB terminal 4 is exposed. In this state, the USB terminal 4 of the USB flash memory is inserted into a personal computer. When it is removed from the personal computer, the state of FIG. 7 is recovered through the reversal of the aforementioned process.

Figure 16:
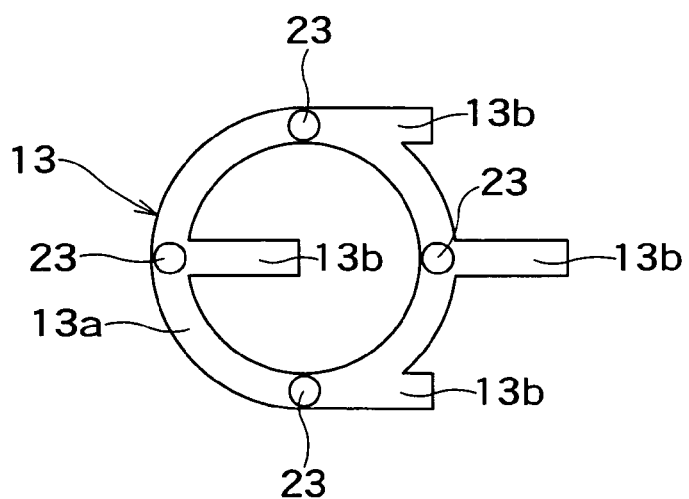
FIG. 16 is an explanatory drawing showing another example of the groove and projections.

As described above, the memory main body 1 and the cap 2 perform the two movements, i.e., the compressive and extensive linear movement and the rotational movement. In the aforementioned embodiment, the two projections used for slidable rotation 23,23 are formed so as to have a predetermined distance therebetween, and the movements are performed by the guidance of these projections 23,23. Accordingly, the memory main body 1 and the cap 2, i.e., the main body housing 7 of the memory main body 1 and the top plate 21 and the bottom plate 22 of the cap 2 move without being greatly inclined relative to each other but with preferably keeping the mutual parallelistic relationship. This is particularly effective in the case of the rotational movement. As will be described later, the same applies to the case where four projections 23 are provided (FIG. 16).

Figure 8:
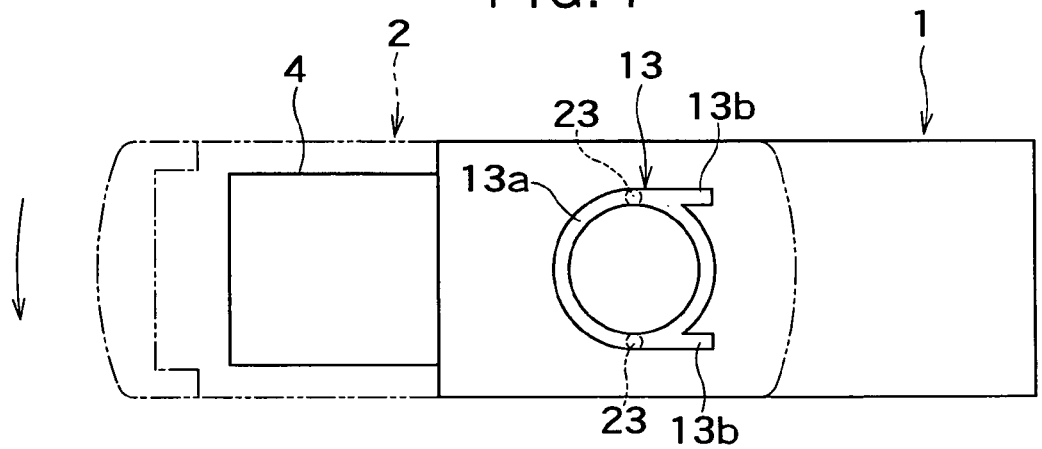
FIG. 8 is a plan view for explaining a positional state of the memory main body and the cap.
Figure 12:
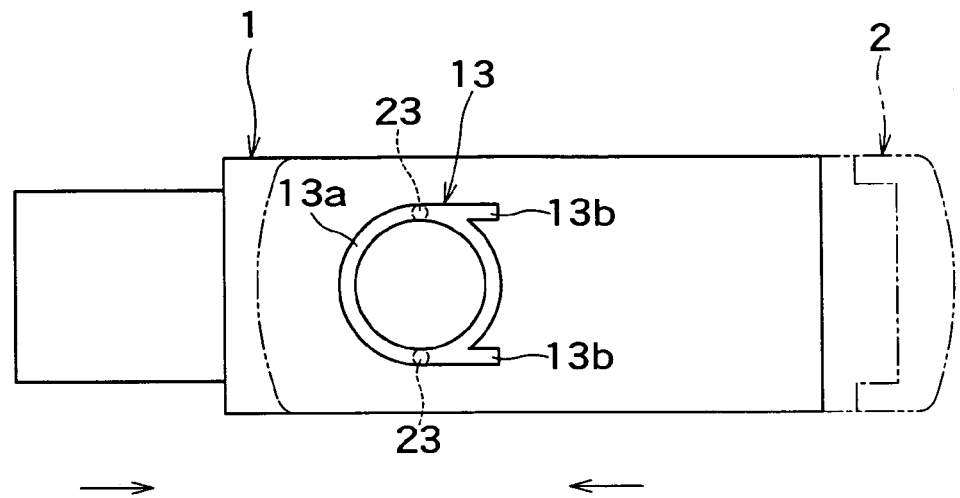
FIG. 12 is a plan view for explaining a positional state of the memory main body and the cap.

As is apparent from the above descriptions, in the device of this embodiment, the first position shown in FIG. 7 and the second position shown in FIG. 8 can be reversibly changed by compressing or extending movement of the two elements, and the third position shown in FIG. 12 and the fourth position shown in FIG. 13 can also be reversibly changed by compressing or extending movement of the two elements. Of course, it is apparent that the first position shown in FIG. 7 can be recovered from the fourth position shown in FIG. 13.

In the usage state shown in FIG. 13, the cap 2 is not removed from the memory main body 1. Accordingly, it is not likely that the cap 2 is lost. Furthermore, in both the non-usage state shown in FIG. 7 and the usage state shown in FIG. 13, the relative rotations of the cap 2 and the memory main body 1 are prevented, and these two elements are mechanically fixed. Accordingly, in these states, they can be stably assembled and used. When the cap 2 and the memory main body 1 are rotated relative to each other, the central axis of the rotation is set to be perpendicular to the top plate 21 or the bottom plate 22, i.e., perpendicular to the paper surface of FIG. 7. Accordingly, the rotational movement of the memory main body 1 and the cap 2 is performed so that the memory main body 1 and the cap 2 are substantially always in one plane. Thus, the movement of the memory main body 1 and the cap 2 can be made compact, and performed substantially in one plane. In the usage state shown in FIG. 13, the cap is rotated around the vertical axis so as to cover the memory main body from the direction opposite to the previous direction. Accordingly, the width and the thickness of the entire product are not changed. Accordingly, the size of the device can be considered based on that of the non-usage state shown in FIG. 7 so that when the device is connected to a USB terminal of, for example, a notebook PC, the device does not interfere with another peripheral device connected to an adjacent USB terminal. Thus, it is not necessary to consider the margin in size of the usage state shown in FIG. 13.

Figure 14:
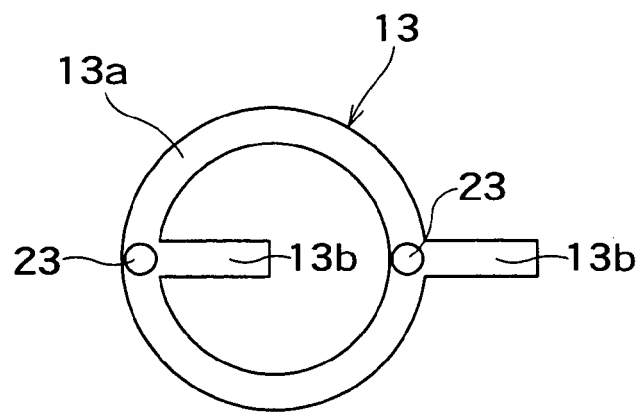
FIG. 14 is an explanatory drawing showing another example of the groove.
Figure 15:
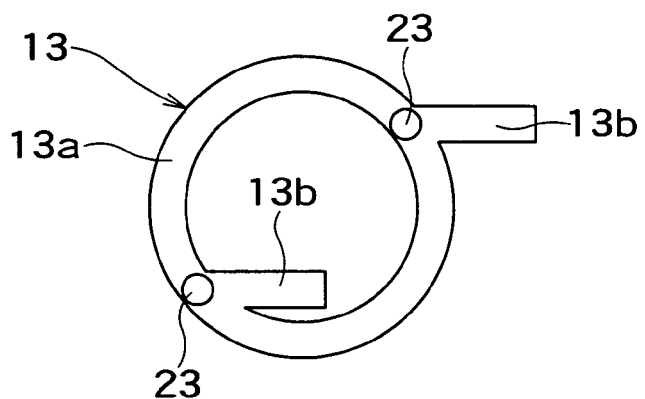
FIG. 15 is an explanatory drawing showing another example of the groove.

Besides the aforementioned shape, the shape of the groove 13 can be those shown in FIGS. 14 and 15. Furthermore, as shown in FIG. 16, four projections 23 can be provided to each of the top plate 21 and the bottom plate 22. In this case, as shown in FIG. 16, the groove 13 is formed to have four guide groove portions. In any of such cases, the state of the memory main body 1 and the cap 2 can be changed between the fixed state and the free state by the insertion and extraction movements in the axial direction. In the free state, it is possible to make the memory main body 1 and the cap 2 perform the rotational movements as described before.

Figure 17:
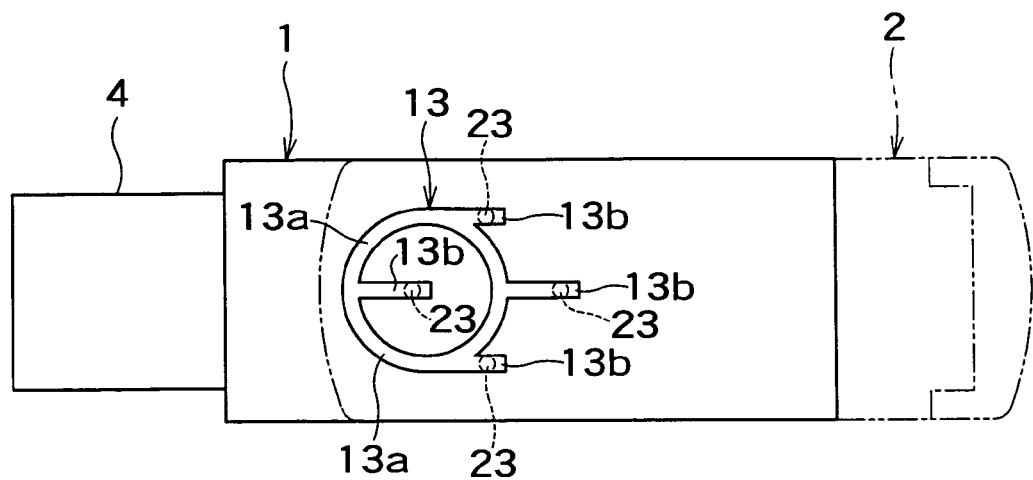
FIG. 17 is a plan view showing the example of FIG. 16 in a first usage state.
Figure 18:
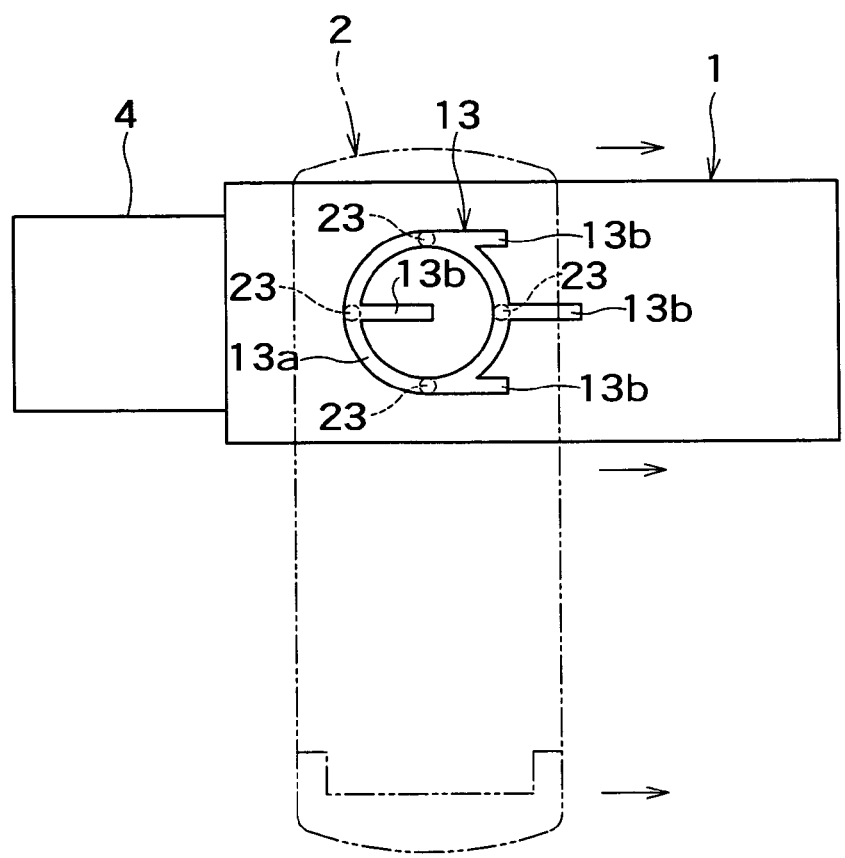
FIG. 18 is a plan view showing the process in which the example of FIG. 16 changes into a second usage state.
Figure 19:
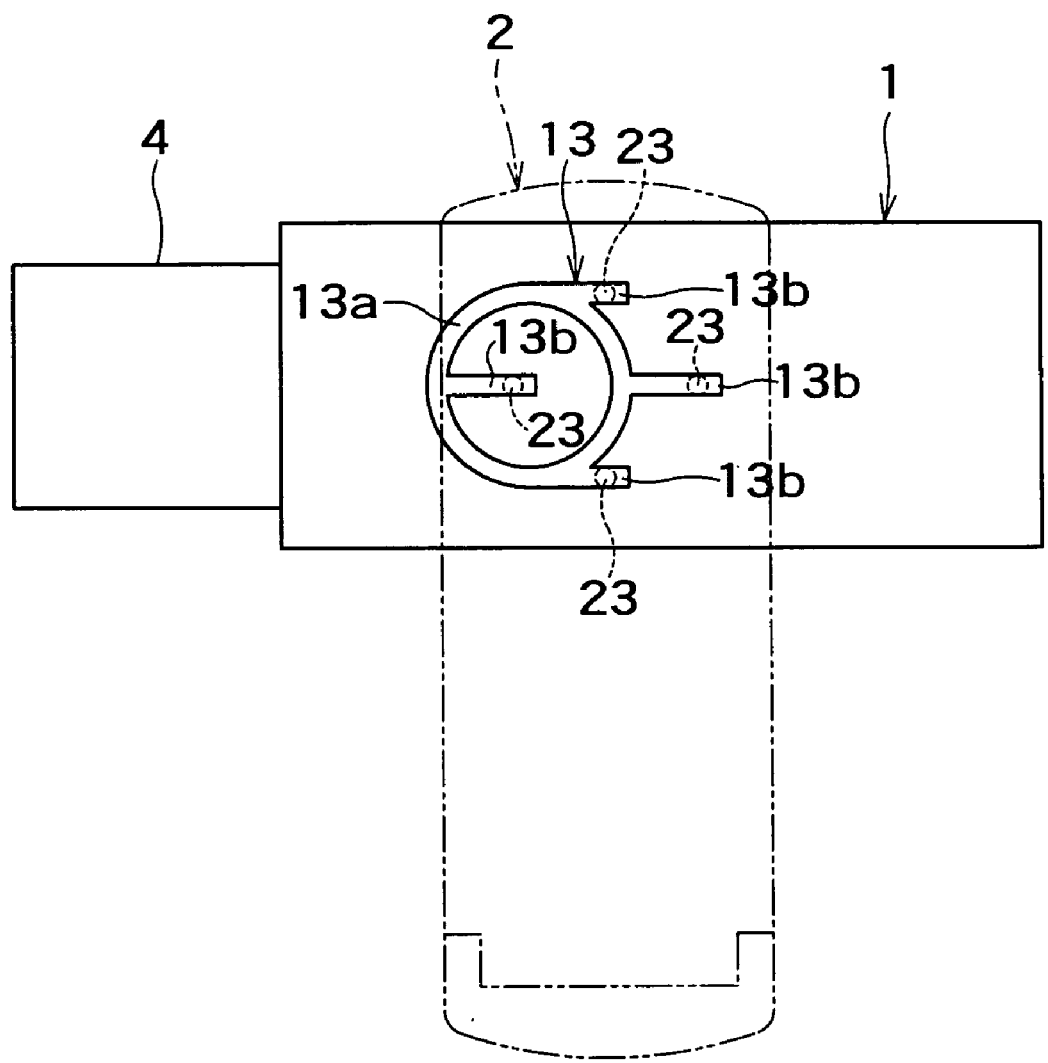
FIG. 19 is a plan view after the positional state shown in FIG. 18 is completely changed to the second usage state.

Furthermore, in the case of employing the groove 13 shown in FIG. 16, the cap 2 can be linearly moved relative to the memory main body 1 not only at the position 180° rotated from the original position as shown in FIG. 17, but also at the position 90° rotated from the original position as shown in FIGS. 18 and 19, and the device can be inserted to a personal computer in the state shown in FIG. 19. The state of FIG. 17 and the state of FIG. 19 can be selected in consideration of the space etc. of the environment. That is to say, when the state of FIG. 19 is employed, the axial length of the memory (the horizontal direction in FIG. 19) can be shortened as compared to the state of FIG. 17.

It is possible to employ both FIG. 1 and FIG. 14 to form an embodiment. For example, one of the top plate 21 and the bottom plate 22 shown in FIG. 2 is formed to have the projections 23 and the groove 13 shown in FIG. 1, and the other is formed to have the projections 23 and the groove 13 shown in FIG. 14. That is to say, the pair of projections 23 of the top plate 21 are 90° shifted from the pair of projections 23 of the bottom plate 23. With such a configuration, the parallelistic relationship of the memory main body 1 and the cap 2 can be maintained more securely even if a margin in size were set to the device in consideration of the assembly process. For example, in the rotational movement shown in FIG. 9, the central axis of the rotation becomes perpendicular to the paper, thereby securely preventing the main body 1 and the cap 2 from rubbing against each other.

In the above descriptions, the projections 23,23;23,23 are provided to both the top plate 21 and the bottom plate 22 of the cap 2. However, the projections 23,23 can be provided to either of the top plate 21 and the bottom plate 22. Of course, in this case, the groove 13 can be provided to either of the upper and the lower surfaces of the memory main body 1. Furthermore, although the projections are provided in pairs in the above descriptions, a single projection can be provided to each groove.

In the above descriptions, the projections 23 are provided to the cap 2, and the grooves 13 are provided to the memory main body 1. However, contrarily, the projections 23 can be provided to the memory main body 1, and the grooves 13 can be provide to the inside of the cap 2.

Figure 20:
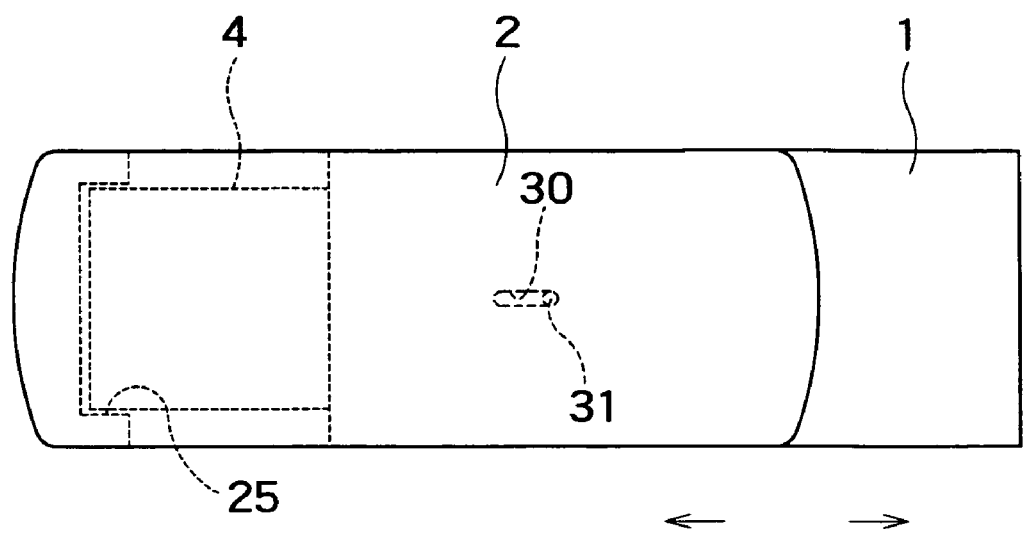
FIG. 20 is a plan view of a USB flash memory according to another embodiment of the present invention.
Figure 21:
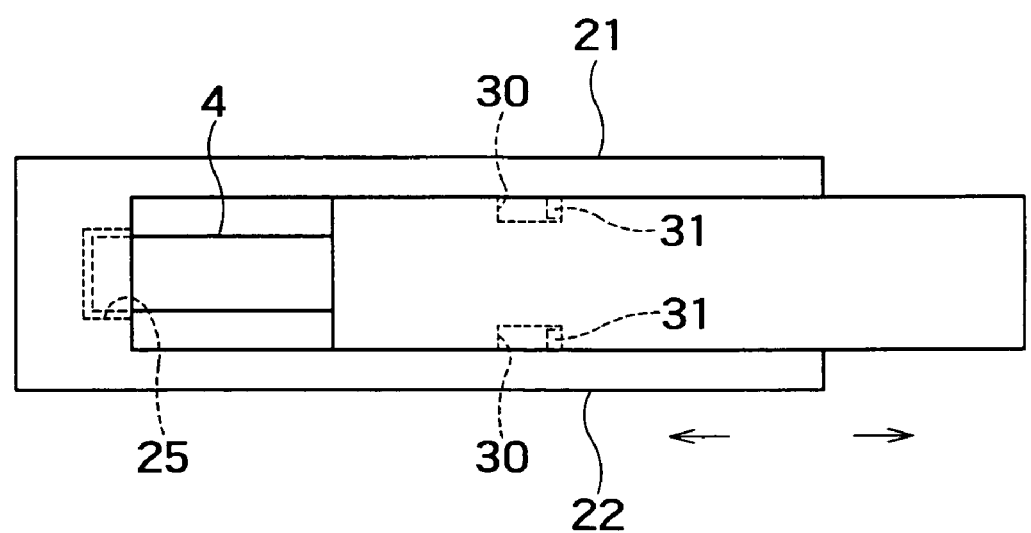
FIG. 21 is a side view of the USB flash memory of FIG. 20.
Figure 22:
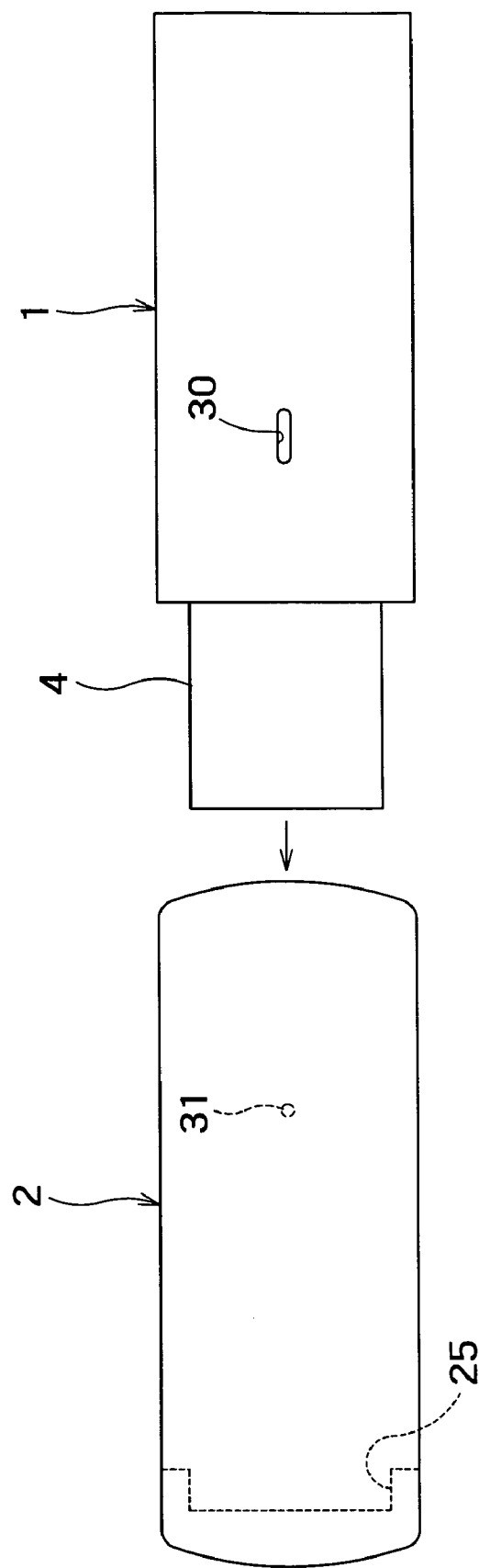
FIG. 22 is a plan view of a memory main body and a cap of the USB flash memory of FIG. 20, which are separated.
Figure 23:
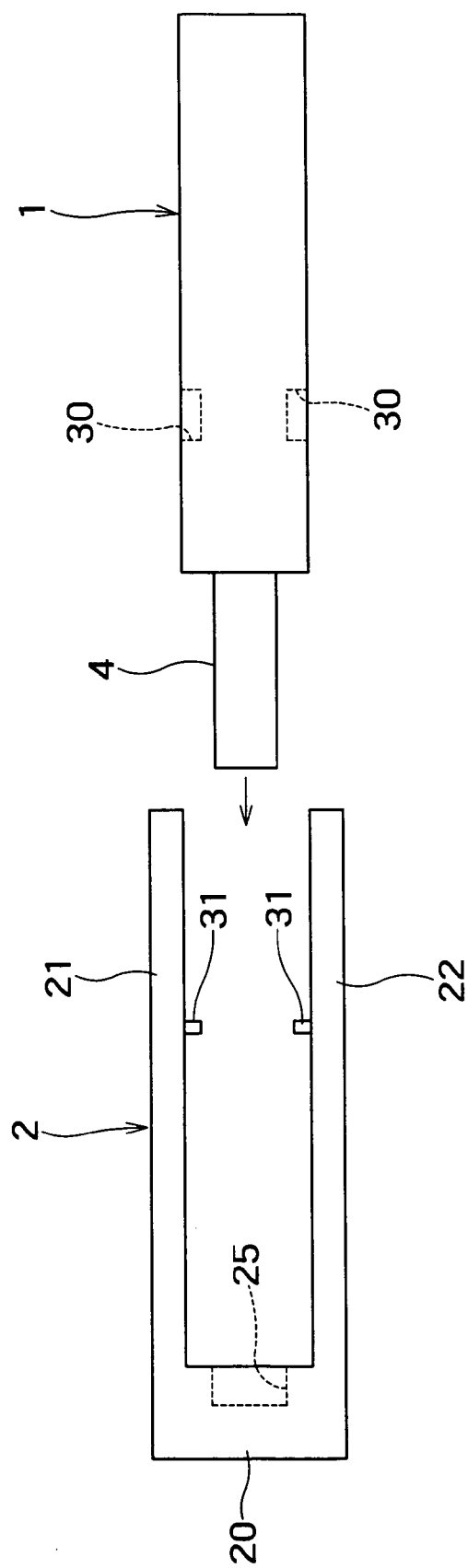
FIG. 23 is a side view of the memory main body and the cap of FIG. 20, which are separated.

FIGS. 20–23 show another embodiment of the present invention. FIG. 20 is a plan view of a device according to this embodiment, FIG. 21 is a side view thereof, FIG. 22 is a plan view of the memory main body 1 and the cap 2 in a separated state, and FIG. 23 is a side view of the separated state shown in FIG. 22. Since these drawings correspond to FIGS. 1–4 previously described, detailed explanations of these drawings are omitted. As can be understood from FIGS. 20 and 21, for example, linear slidable rotation guide grooves 30, 30 are provided to a pair of surfaces (upper and lower surfaces) of the memory main body 1 facing the top plate 21 and the bottom plate 22 of the cap 2. Accordingly, pins (projections used for slidable rotation) 31,31 are provided to the internal surfaces of the top plate 21 and the bottom plate 22 of the cap 2. FIGS. 22 and 23 show the planar shape, the sectional shape, and the positions of the aforementioned grooves 30 and the positions of the aforementioned pins 31. As can be understood especially from FIG. 21, the pins 31 and the grooves 30 engage with each other. In this state, the USB terminal 4 is inserted to the groove 25, which prevents the rotations of the memory main body 1 and the cap 2 relative to each other. As is similar to the case of the aforementioned embodiment shown in FIG. 8, from the state shown in FIGS. 20 and 21, the memory main body 1 and the cap 2 are moved away from each other. As a result, the memory main body 1 and the cap 2 are allowed to rotate around an axis passing through the pins 31, 31. When they are rotated 180 degrees, they can be moved in a shrinking direction, as is similar to the state shown in FIG. 13.

Figure 24:
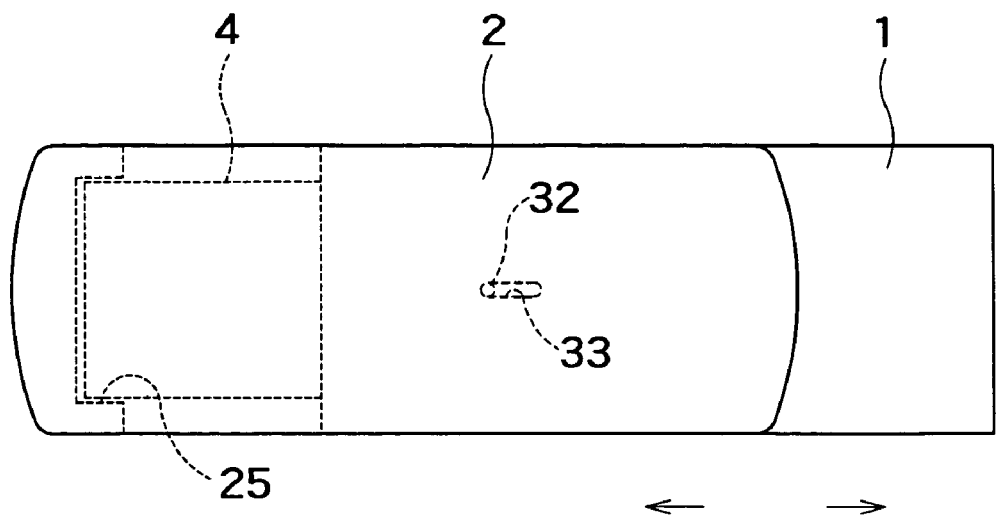
FIG. 24 is a plan view of a USB flash memory according to further another embodiment of the present invention.
Figure 25:
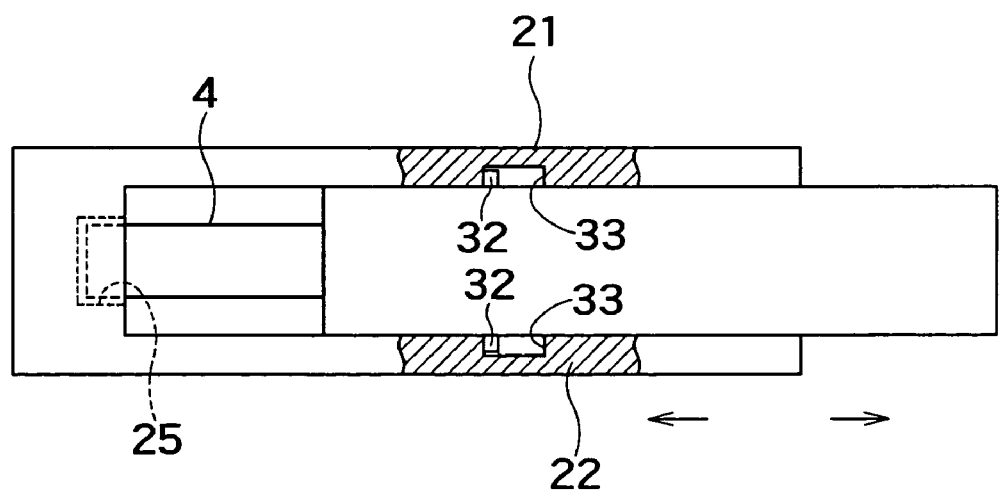
FIG. 25 is a side view of the USB flash memory of FIG. 24.

FIGS. 24 and 25 show another embodiment of the present invention, in which pins 32, 32 are provided to the memory main body 1, and grooves (slidable rotation guide grooves) 33, 33 are provided to the cap 2, contrary to the embodiment shown in FIGS. 20–23.

Figure 26:
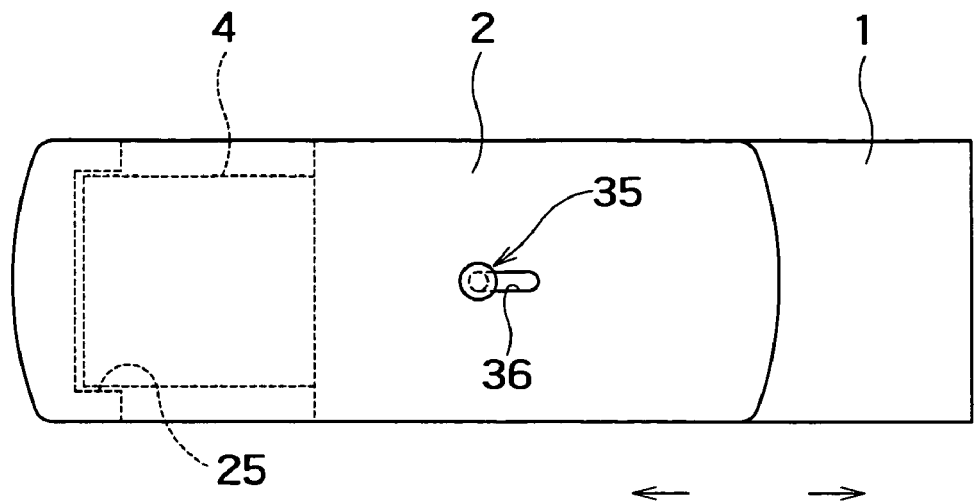
FIG. 26 is a plan view of a USB flash memory according to further another embodiment of the present invention.
Figure 27:
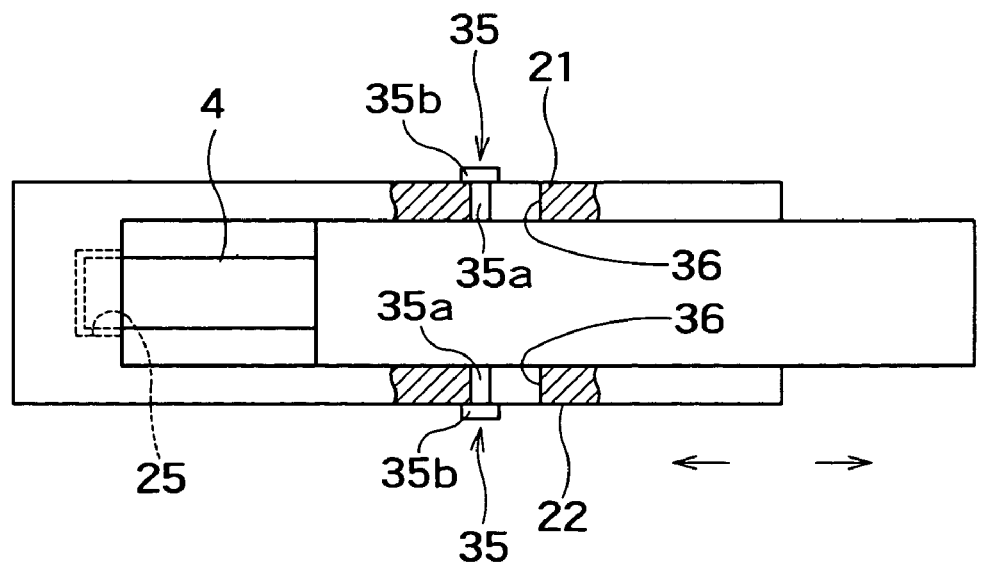
FIG. 27 is a side view of the USB flash memory of FIG. 26.

In the embodiment shown in FIGS. 24 and 25, in order to ensure that the cap 2 is not removed from the memory main body 1, the structure shown in FIGS. 26 and 27 can be employed. That is to say, the slidable rotation guide grooves 36 can be formed to penetrate the top plate 21 and the bottom plate 22, the axis parts 35a of the pins 35 are put into the grooves 36 so as to pass therethrough, and head parts 35b, the diameter of which is wider than that of the axis parts 35a, are located outside the top plate 21 and the bottom plate 22. In this case, covering parts (not shown in the drawings) for covering the pins 35 and the grooves 36 can be provided from the outside of the top plate 21 and the bottom plate 22 of the cap 2, thereby preventing the pins 35 and the grooves 36 from being exposed to the outside.

According to the embodiments shown in FIGS. 20–27, it is possible to prevent the cap from being lost with a very simple structure.

Furthermore, as described above, the present invention can be applied to other peripheral devices etc., including a USB terminal, instead of the USB flash memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

I claim:

1. A device with a USB terminal comprising:

a device main body including a USB terminal; and a cap including a housing space for housing at least the USB terminal, the device main body and the cap being assembled so that they can be moved in an extending or compressing manner relative to each other by inserting at least the USB terminal to the housing space, or can be rotated relative to each other in an extended state, the cap including a base member, and a top plate and a bottom plate facing each other, the top plate and bottom plate being supported by the base member, and the housing space being formed by the base member, the top plate, and the bottom plate, projections used for slidable rotation being formed on one of an internal surface of at least one of the top plate and the bottom plate, and at least one of an upper surface and a lower surface of the device main body, and slidable rotation guide grooves, in which the projections are inserted, being formed on the other, each of the slidable rotation guide grooves including a circular groove portion, which is substantially circular, and guide groove portions formed to be integral with the circular groove portions and extending in a compressing or extending direction of the device main body and the cap, the device main body and the cap being moved in the extending or compressing manner relative to each other when the projections are moved between the guide groove portions and the circular groove portions, and being rotated relative to each other when the projections are slid in the circular groove portions, and at a first position where the device main body and the cap are close to each other, the projections being located in the guide groove portions, at a second position where the device main body and the cap have been moved so as to be away from each other, the projections being located in the circular groove portions, a third position of the device main body and the cap being achieved when the projections are rotated from the second position within the circular groove portions, and a fourth position being achieved when the projections are reversely moved in the guide groove portions from the third position.

2. The device with a USB terminal according to claim 1, wherein two projections used for slidable rotation are provided to each slidable rotation guide groove, and two guide groove portions are provided to each slidable rotation guide groove.

3. The device with a USB terminal according to claim 1, wherein four projections used for slidable rotation are provided to each slidable rotation guide groove, and four guide groove portions are provided to each slidable rotation guide groove.

4. The device with a USB terminal according to claims 1, wherein the base member of the cap includes a housing groove for housing a tip portion of the USB terminal.

5. The device with a USB terminal according to any of claims 1, wherein the device main body includes a board assembly having the USB terminal at an end portion thereof, and a main body housing for covering the board assembly with the USB terminal being exposed.

6. A device with a USB terminal comprising:
a device main body including a USB terminal; and
a cap including a housing space for housing the device main body at a side of the USB terminal,
the cap including a base member, and a top plate and a bottom plate facing each other, the top plate and bottom plate being supported by the base member, and the housing space being formed by the base member, the top plate, and the bottom plate,
projections used for slidable rotation being formed on one of an internal surface of at least one of the top plate and the bottom plate and at least one of an upper surface and lower surface of the device main body, and slidable rotation guide grooves, in which the projections used for slidable rotation are slidably and rotatably inserted, are formed on the other along an axial direction of the device main body and the cap, and a length of the slidable rotation guide grooves being adjusted such that the device main body and the cap can be located in a close position for preventing a rotational movement relative to each other, and a distant position for performing a rotational movement relative to each other.

7. The device with a USB terminal according to claim 6, wherein the base member of the cap includes a housing groove for housing a tip portion of the USB terminal, and a depth of the housing groove is set so that at the close position, the tip portion of the USB terminal is housed in the housing groove to prevent mutual rotational movements of the cap and the device main body, and at the distant position, the tip portion of the USB terminal is pulled out of the housing groove, thereby allowing mutual rotational movements.

8. The device with a USB terminal according to claim 6, wherein one of the slidable rotation guide grooves and the projections used for slidable rotation is formed on both the internal surface of the top plate and the internal surface of the bottom plate, and the other is formed on both the upper surface and the lower surface of the device main body.

9. The device with a USB terminal according to claim 7 wherein one of the slidable rotation guide grooves and the projections used for slidable rotation is formed on both the internal surface of the top plate and the internal surface of the bottom plate, and the other is formed on both the upper surface and the lower surface of the device main body.

10. The device with a USB terminal according to claim 6, wherein:
the projections used for slidable rotation are formed on the device main body, and the slidable rotation guide grooves are formed on the cap,
the slidable rotation guide grooves are formed on at least one of the top plate and the bottom plate so as to penetrate the top plate and the bottom plate in a thickness direction, each projection used for slidable rotation has an axis part and a head part having a larger diameter than the axis part, the axis part passing through the slidable rotation guide groove from an internal side to an external side, the head part being located at the outside of at least one of the top plate and the bottom plate.

11. A device with a USB terminal comprising:
a device main body including a USB terminal; and
a cap including a housing space for housing at least the USB terminal,
the cap including a base member, and a top plate and a bottom plate facing each other, the top plate and bottom plate being supported by the base member, and the housing space being formed by the base member, the top plate, and the bottom plate,
projections used for slidable rotation being formed on one of an internal surface of at least one of the top plate and the bottom plate, and at least one of an upper surface and a lower surface of the device main body, and slidable rotation guide grooves, in which the projections are inserted, being formed on the other,
the device main body and the cap being moved in an extending or compressing manner relative to each other when the projections are relatively slid in the grooves, and the device main body and the cap being moved in a rotational manner relative to each other when the projections and the grooves are rotated relative to each other.

12. The device with a USB terminal according to claim 11, wherein each slidable rotation guide groove has linear portions and a circular portion, and the device main body and the cap are moved in an extending or compressing manner relative to each other when the projections used for slidable rotation are relatively slid in the linear portions, and the device main body and the cap are rotated relative to each other when the projections are relatively slid in the circular portion.

13. The device with a USB terminal according to claim 11, wherein each slidable rotation guide groove has a linear portion, and the device main body and the cap are moved in an extending or compressing manner or in a rotational manner when the projections used for slidable rotation are relatively slid or rotated in the linear portion.

* * * * *